(12) United States Patent
Ellul et al.

(10) Patent No.: US 7,943,473 B2
(45) Date of Patent: May 17, 2011

(54) MINIMUM COST METHOD FOR FORMING HIGH DENSITY PASSIVE CAPACITORS FOR REPLACEMENT OF DISCRETE BOARD CAPACITORS USING A MINIMUM COST 3D WAFER-TO-WAFER MODULAR INTEGRATION SCHEME

(75) Inventors: Joseph Paul Ellul, San Jose, CA (US); Khanh Tran, Milpitas, CA (US); Albert Bergemont, Palo Alto, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 215 days.

(21) Appl. No.: 12/352,679

(22) Filed: Jan. 13, 2009

(65) Prior Publication Data

US 2010/0178747 A1     Jul. 15, 2010

(51) Int. Cl.
    *H01L 21/20* (2006.01)
(52) U.S. Cl. .................................. 438/386; 438/381
(58) Field of Classification Search .......... 438/381, 438/386
    See application file for complete search history.

(56) References Cited

U.S. PATENT DOCUMENTS

| | | | |
|---|---|---|---|
| 2004/0032308 A1 | 2/2004 | Cheung et al. | |
| 2005/0046041 A1 | 3/2005 | Tsai | |
| 2006/0115952 A1 | 6/2006 | Wu | |
| 2007/0001203 A1* | 1/2007 | Lehr et al. | 257/296 |
| 2007/0045759 A1 | 3/2007 | Chung et al. | |
| 2007/0096249 A1 | 5/2007 | Roeper et al. | |
| 2007/0114651 A1 | 5/2007 | Marimuthu et al. | |
| 2007/0152258 A1* | 7/2007 | Kim | 257/309 |
| 2008/0014696 A1* | 1/2008 | Tsai | 438/243 |
| 2008/0036034 A1 | 2/2008 | Juskey et al. | |
| 2008/0054428 A1 | 3/2008 | Lam | |
| 2008/0157267 A1 | 7/2008 | Gerber et al. | |
| 2008/0217708 A1 | 9/2008 | Reisner et al. | |
| 2010/0230818 A1* | 9/2010 | Birner et al. | 257/751 |

FOREIGN PATENT DOCUMENTS

| | | |
|---|---|---|
| EP | 0581475 | 2/1994 |
| WO | WO 2004/114397 | 12/2004 |
| WO | WO 2007/005141 | 1/2007 |
| WO | WO 2007/082854 | 7/2007 |

OTHER PUBLICATIONS

"International Search Report and Written Opinion of the International Searching Authority Dated Apr. 6, 2010", International Application No. PCT/US2010/020400.

* cited by examiner

*Primary Examiner* — Bradley K Smith
(74) *Attorney, Agent, or Firm* — Blakely Sokoloff Taylor & Zafman LLP

(57) ABSTRACT

Passive, high density, 3d IC capacitor stacks and methods that provide the integration of capacitors and integrated circuits in a wafer to wafer bonding process that provides for the integration of capacitors formed on one wafer, alone or with active devices, with one or more integrated circuits on one or more additional wafers that may be stacked in accordance with the process. Wafer to wafer bonding is preferably by thermo-compression, with grinding and chemical mechanical polishing being used to simply aspects of the process of fabrication. Various features and alternate embodiments are disclosed.

40 Claims, 16 Drawing Sheets

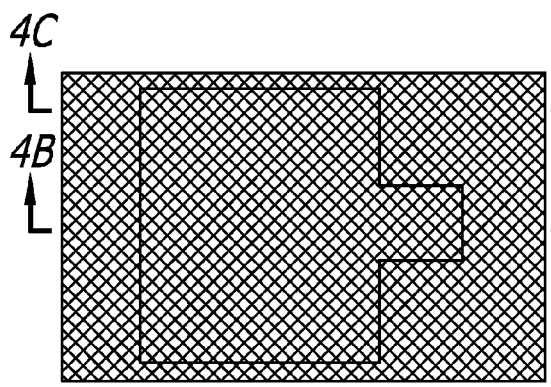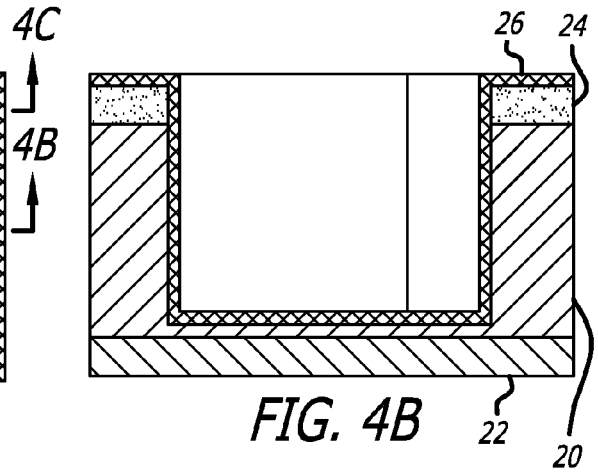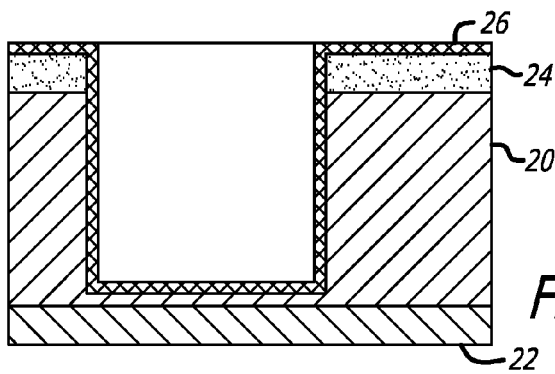
FIG. 4A  FIG. 4B  FIG. 4C
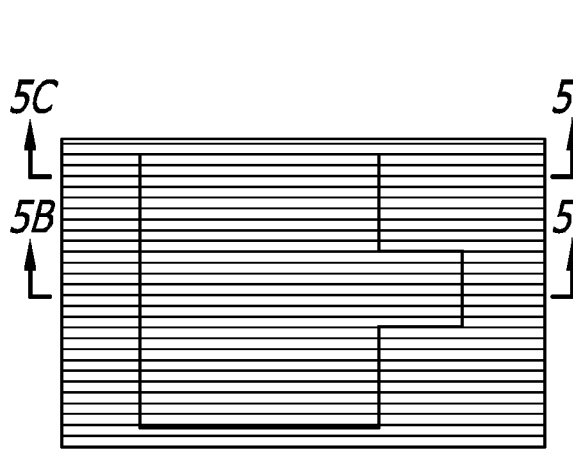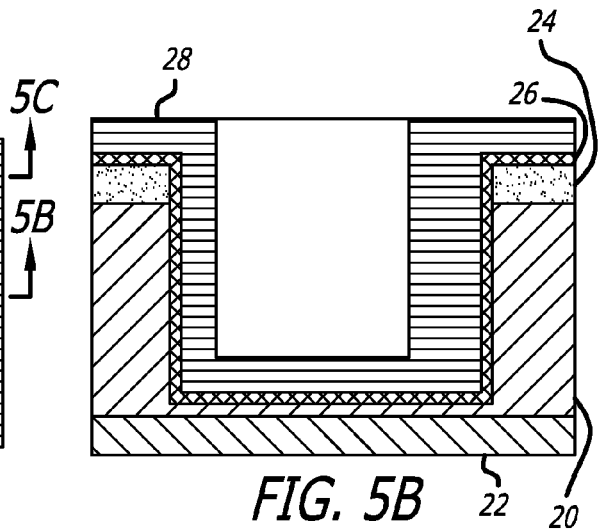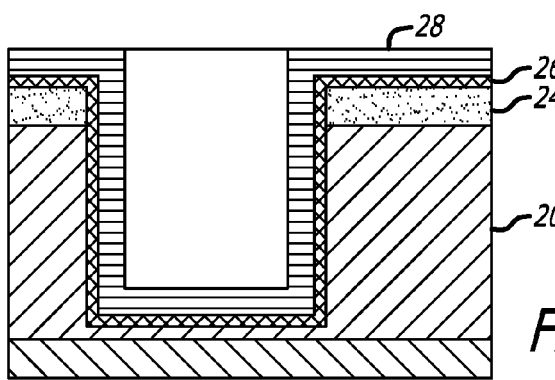
FIG. 5A  FIG. 5B  FIG. 5C

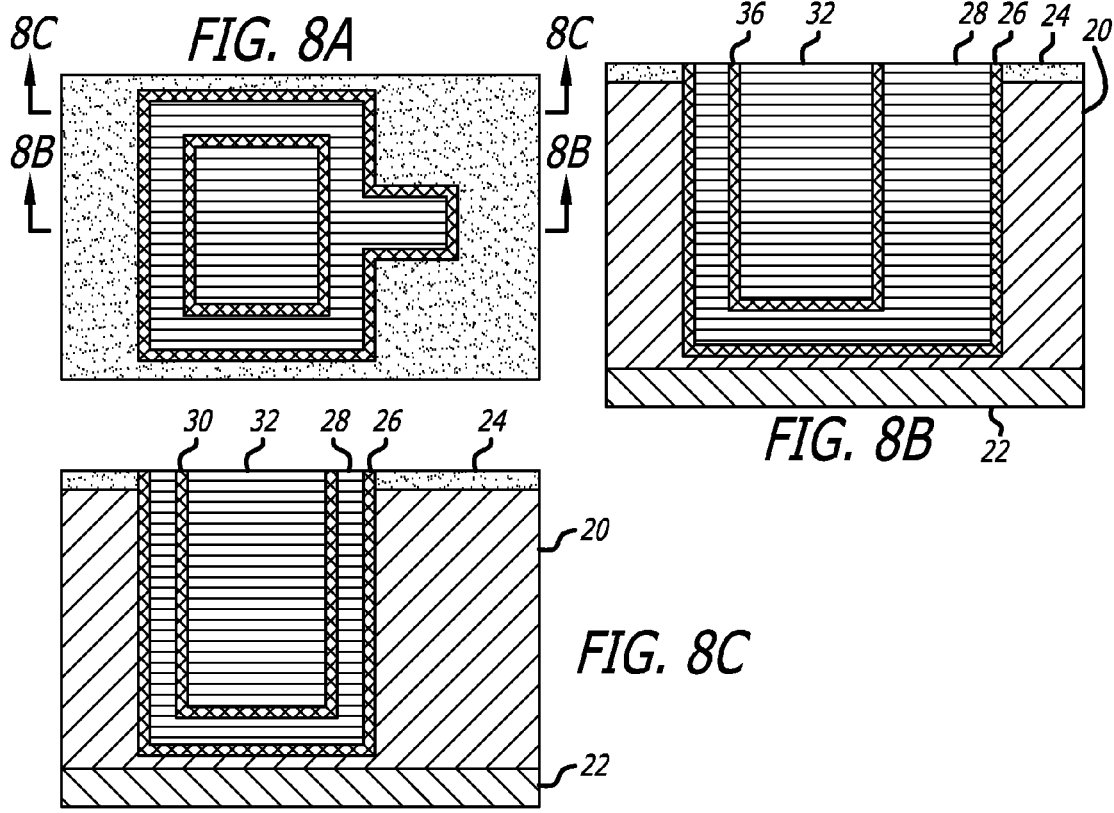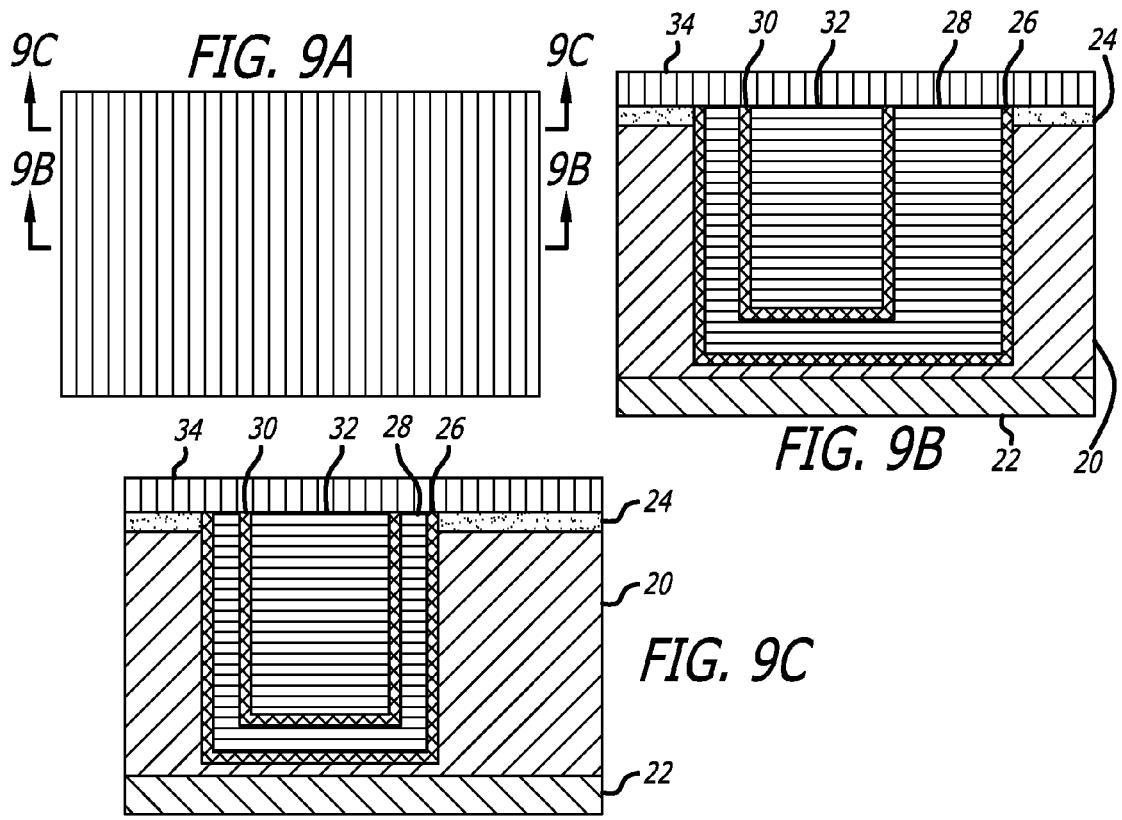

MINIMUM COST METHOD FOR FORMING HIGH DENSITY PASSIVE CAPACITORS FOR REPLACEMENT OF DISCRETE BOARD CAPACITORS USING A MINIMUM COST 3D WAFER-TO-WAFER MODULAR INTEGRATION SCHEME

BACKGROUND OF THE INVENTION

1. Field of the Invention

The present invention relates to the field of integrated circuits and integrated circuit packaging.

2. Prior Art

Present day 2D Monolithic ICs require discrete devices, such as capacitors, resistors and inductors, at the board level for correct operation. In general, two IC package pinouts are needed for electrical connection to each discrete device. As an example, an IC that needs to connect to 5 capacitors will need 10 extra pinouts. This increased pinout count increases IC package cost, IC area and board space. Additionally, it could degrade overall electrical performance because of the introduction of parasitic capacitance and possibly leakage current and noise.

As an example, certain of the assignee's multi-media IC products need bypass, flying and holding discrete capacitors. When put on a printed circuit board, each of these discrete capacitors needs two additional pinouts on the IC. Unfortunately these discrete capacitors are between 0.1 to 1.0 µF and are much larger in value compared to those utilized in typical CMOS and BiCMOS ICs (few fF). As such, these large value capacitors cannot be integrated in the standard 2D IC products utilizing standard technology available in the marketplace, such as foundries etc.

Despite all the difficulties, the need to integrate these and other board level discrete devices with the IC in one package is very real. Some manufacturers are now finding new ways of doing this. One such method is Linear Technology's "µmodule" technology, wherein individual packages are stacked using solder bumping for the interconnections. In another method of integration, the IC is bumped on top of a larger "passives chip".

Unfortunately, both these techniques have disadvantages because the resulting package is large and therefore costly, and because chip-to-chip bump technology is very costly. Additionally, in the second method, the area of the passives chip is much larger than the area of the bumped chip on top of it, and an additional IC array connected thereto needs additional space, and a ROM array connected thereto needs additional space, making the package very large and with lots of in-and-out of chip interconnects. Whenever the "passive" chip and the active chip (IC) are either of different sizes, or when the device yields per wafer is low, wafer-to-wafer packaging techniques are not practical.

BRIEF DESCRIPTION OF THE DRAWINGS

FIGS. 1 through 10 illustrate an exemplary method of formation of trench capacitors in accordance with the present invention.

DETAILED DESCRIPTION OF THE PREFERRED EMBODIMENTS

Figure 1:
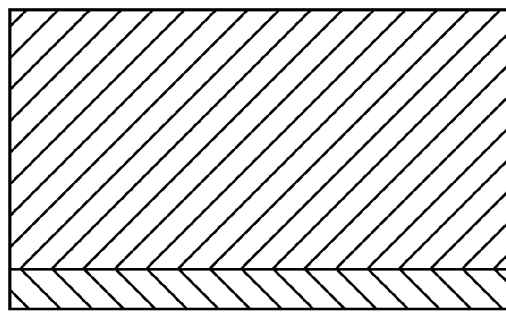
Figure 2:
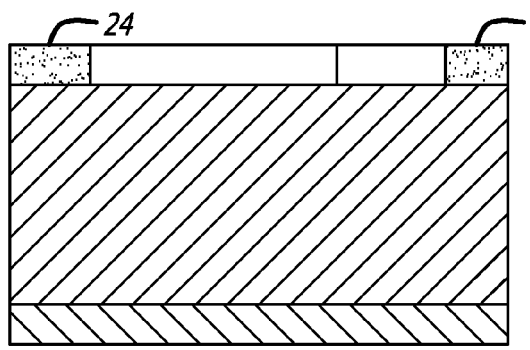
Figure 3A:
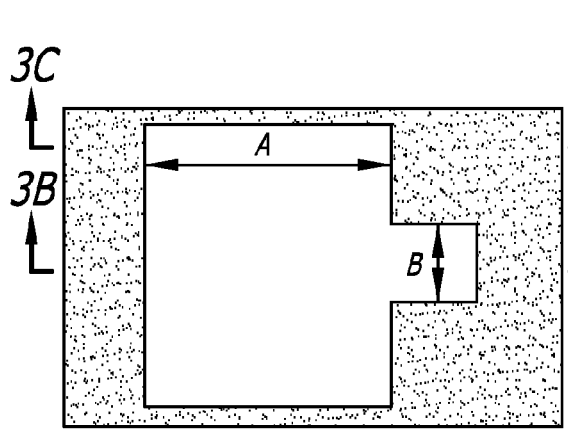
Figure 3B:
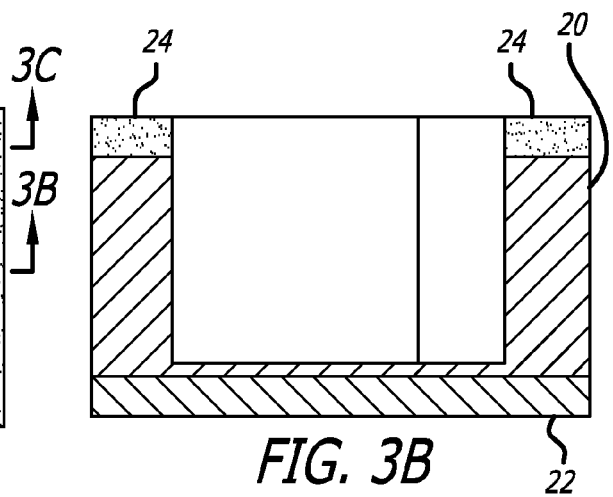
Figure 3C:
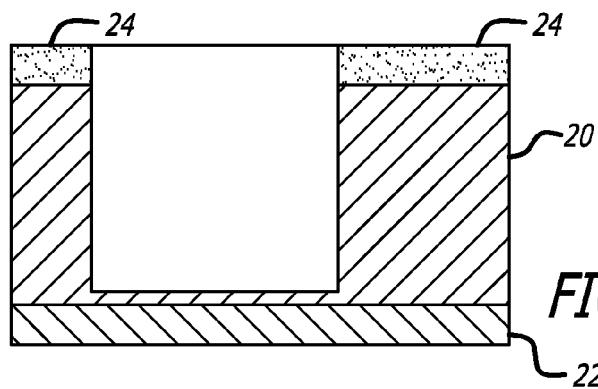
Figure 6A:
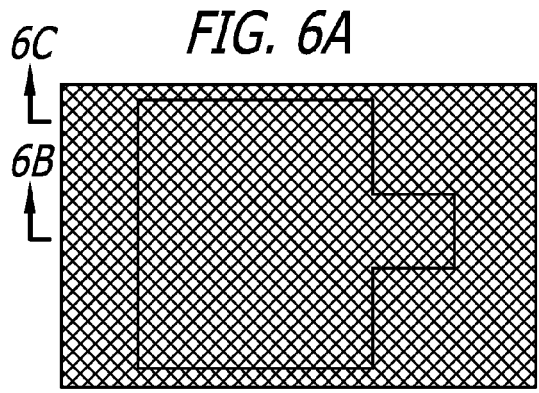
Figure 6B:
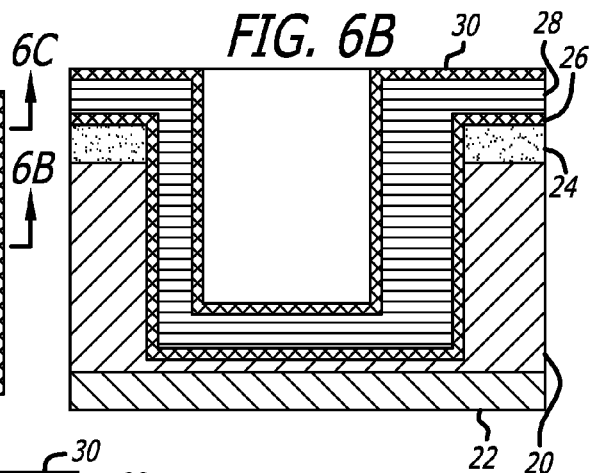
Figure 6C:
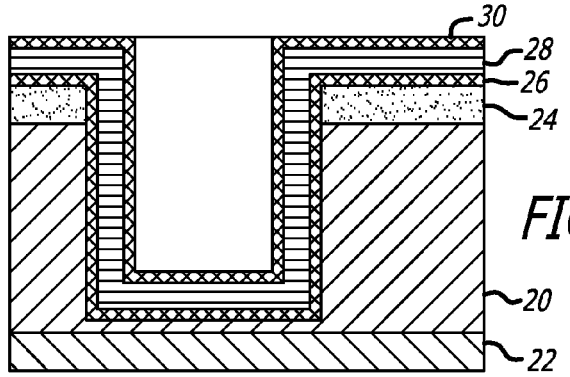
Figure 7A:
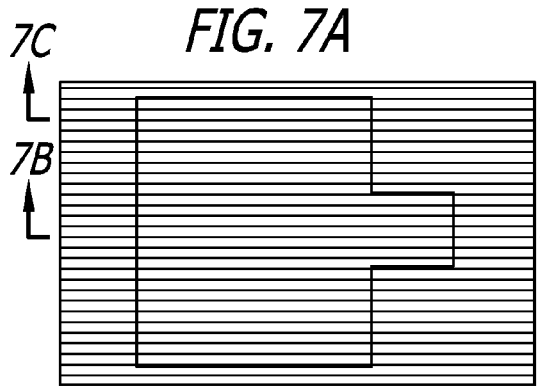
Figure 7B:
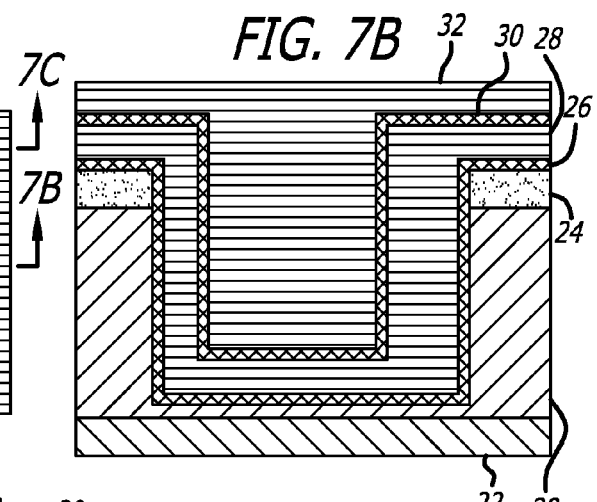
Figure 7C:
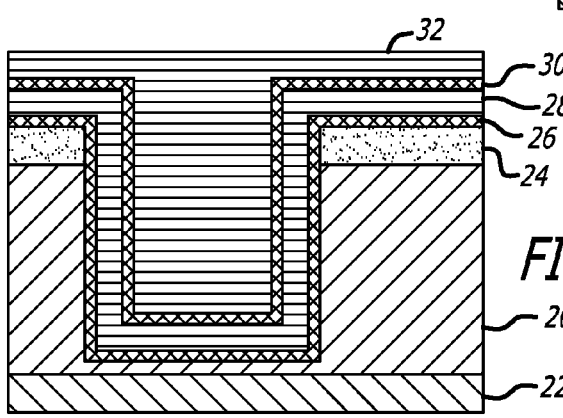
Figure 10:
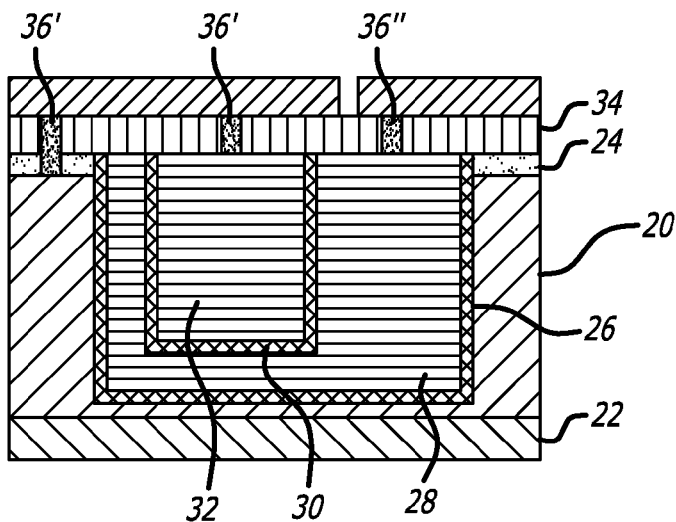

The fabrication of the trench capacitors used in the present invention is illustrated in FIGS. 1 through 10. FIG. 1 illustrates the starting point with a silicon substrate 20 having a backside oxide layer 22 thereon. A hard mask layer is deposited, and using a conventional photomask and etching process, the patterned hard mask layer 24 remains, as shown in FIG. 2. Then a silicon trench etch, using a standard commercial process, is made as shown in FIGS. 3A through 3C. This etch includes area A, and a narrower region B at the side thereof which will provide a region for a contact area for one of the capacitor electrodes. Then a first dielectric deposition 26 is made as shown in FIGS. 4A through 4C. Following that, a first conducting material layer 28, such as a metal or doped polysilicon, is deposited over the oxide layer 24 (FIGS. 5A through 5C) and will serve as an electrode layer. This layer is of sufficient thickness that it not only coats region A (FIG. 3A) with the electrode material of choice but, together with the first dielectric, it also completely fills region B with same material (FIG. 3A) as shown in FIG. 5B. In FIGS. 6A through 6C, a second dielectric layer 30 has been deposited, coating the electrode layer 28. Then a second electrode layer 32 is deposited as shown in FIGS. 7A through 7C, of sufficient thickness that it fills the remaining unfilled part of the trench.

Figure 11:
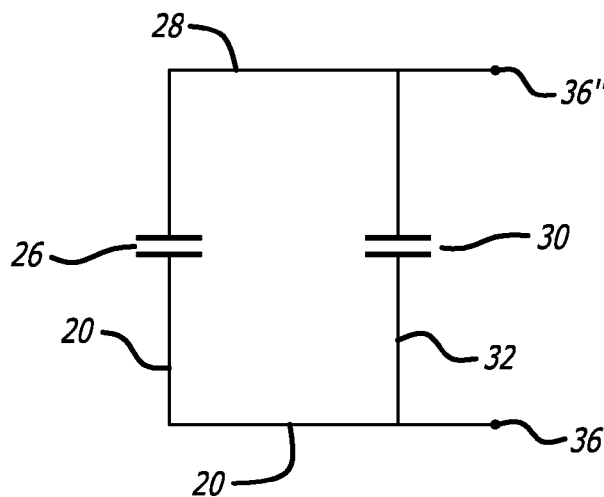
FIG. 11 is a circuit diagram for the exemplary trench capacitor of FIG. 1.

Thereafter a chemical mechanical polishing (CMP) process is used to planarize the top surface and to expose the first electrode layer 28 and the second electrode layer 32 simultaneously, insulated from each other by dielectric layer 30, with electrode layer 28 being insulated from the substrate 20 by dielectric layer 26, as illustrated in FIGS. 8A through 8C. Then an insulating dielectric 34, generally called interlayer dielectric in the industry, is deposited as shown in FIGS. 9A through 9C. This layer will later be photomasked and etched to expose first electrode region 28, second electrode region 32 and the substrate material 20. Then a metal layer 36 will be deposited and patterned to make capacitor contacts 36' and 36" and connect capacitor contact 36' to the substrate 20. The resulting capacitor circuit is shown in FIG. 11. Physically, the capacitor at the right of FIG. 11, formed by layers 32, 30 and 28 is nested within the capacitor at the left of FIG. 11, formed by layers 28, 26 and 20.

In the embodiment described herein, at least one capacitor is shown as electrically being comprised of a pair of capacitors connected in parallel (FIG. 11). Obviously capacitors formed in accordance with the present invention may be fabricated by preferably re-proportioning the trench etch in which the capacitor is to be formed, and then after the first dielectric deposition 26, filling the entire trench with a conducting material to electrically form a single capacitor. Alternatively, a capacitor electrically comprised of more than two capacitors connected in parallel may be formed by further repetition of the steps of depositing a further dielectric layer and conductive layer. In the latter case, because the conductive layer normally will be quite thin, a double layer contact window may be used to each intermediate conductive layer other than the final filling layer, much like was created by region B (FIG. 3A) for contact the intermediate conductive layer 28 in the embodiment disclosed. In essence, three or more capacitors may be nested together and interconnected, as opposed to the two capacitors illustrated.

At the same time as the foregoing process is being carried out, through silicon vias are being formed, as described with respect to FIGS. 12 through 40.

Figure 12:
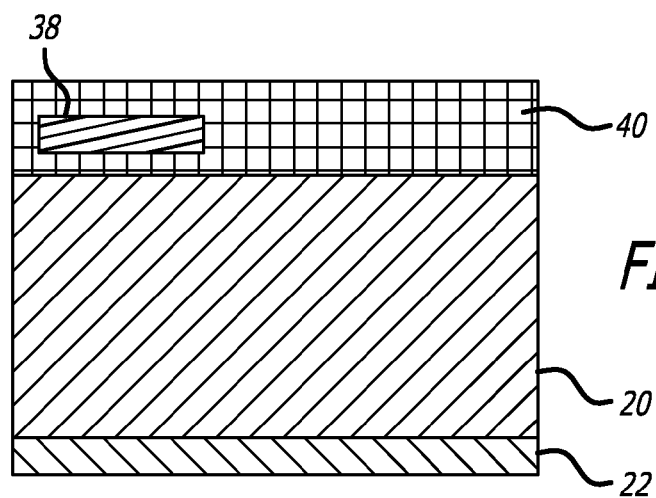
FIGS. 12 through 40 illustrate an exemplary method of formation of through-silicon vias in accordance with the present invention.
Figure 13:
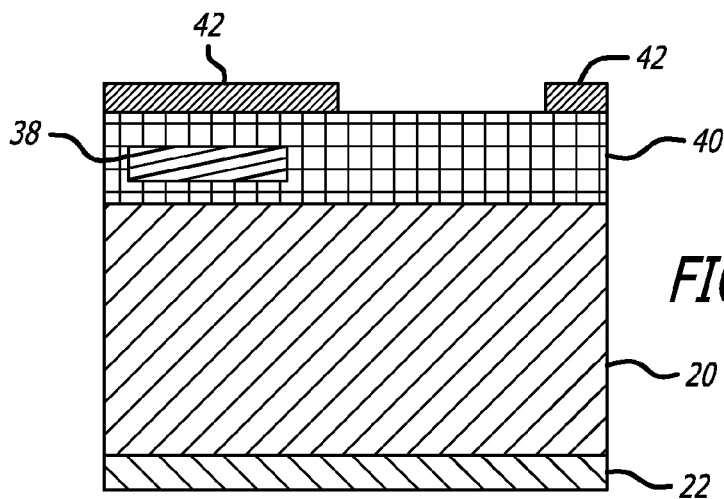
Figure 14:
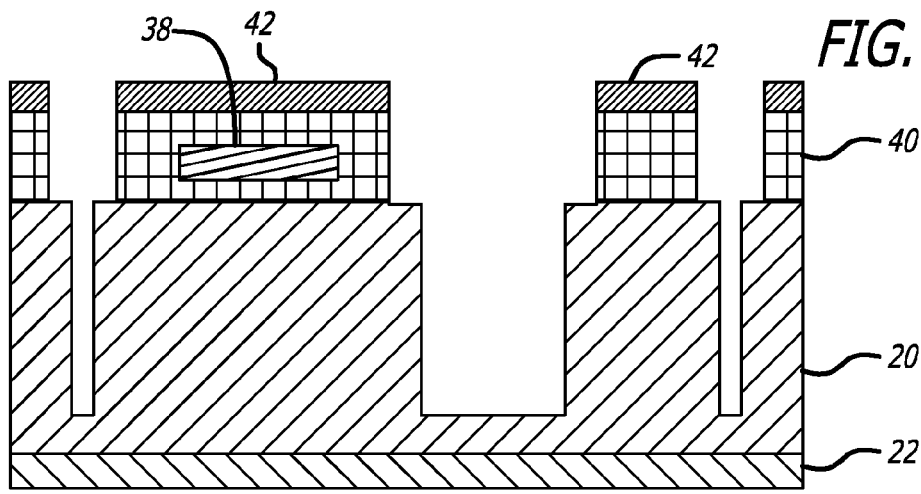
Figure 15:
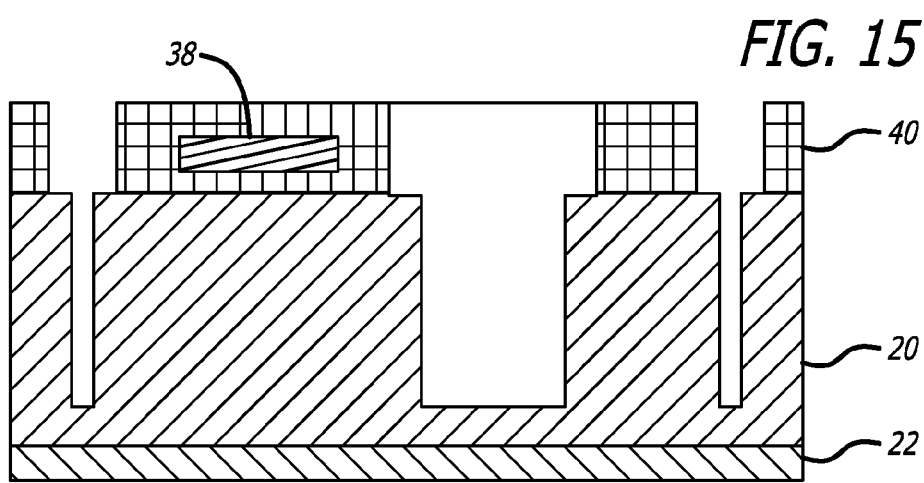
Figure 16:
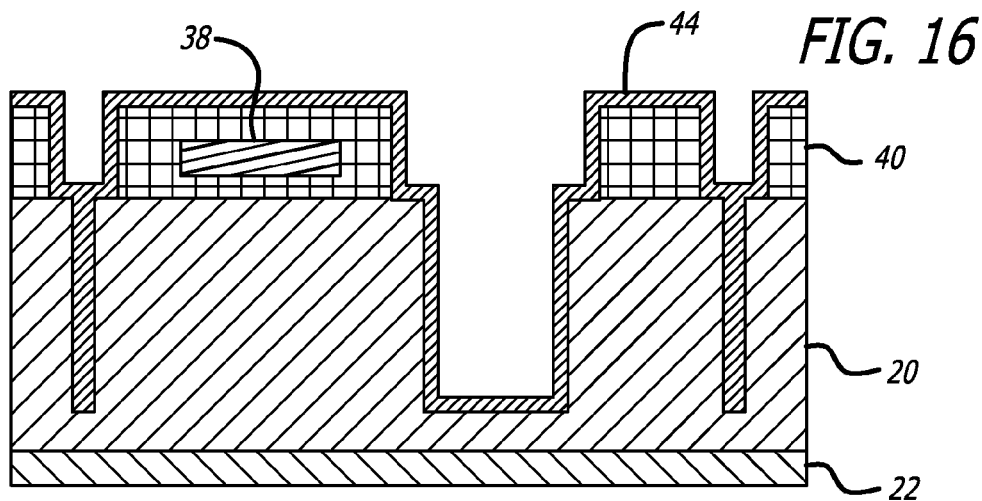
Figure 17:
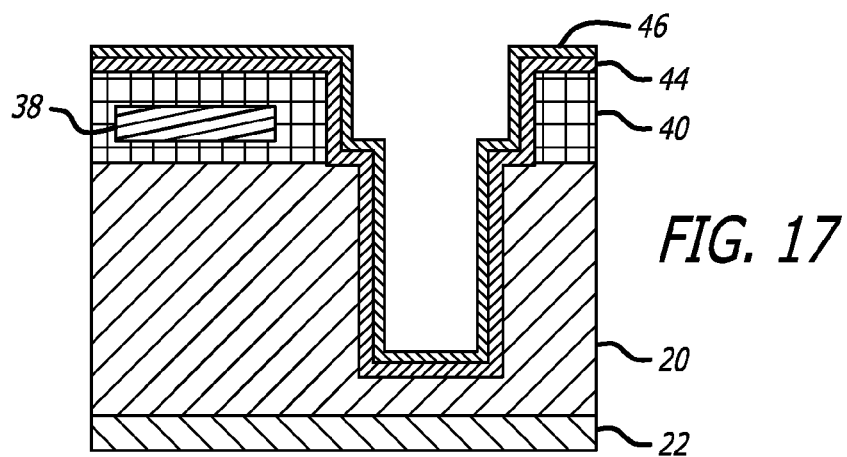
Figure 18:
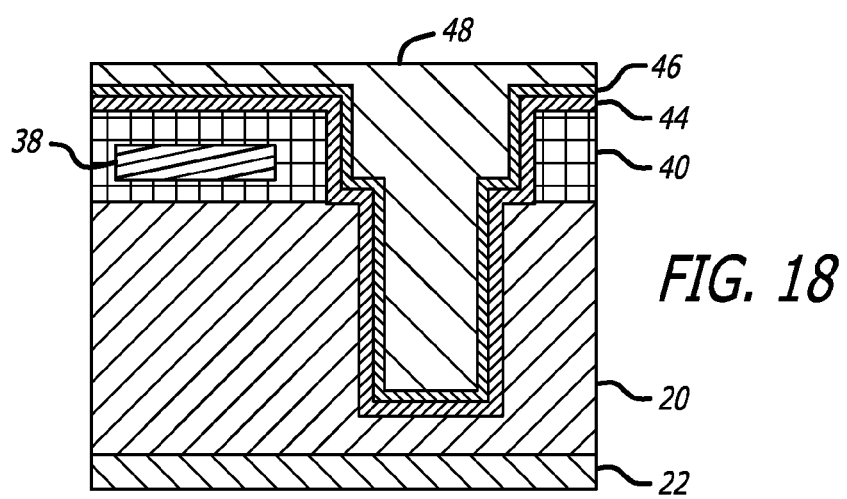
Figure 19:
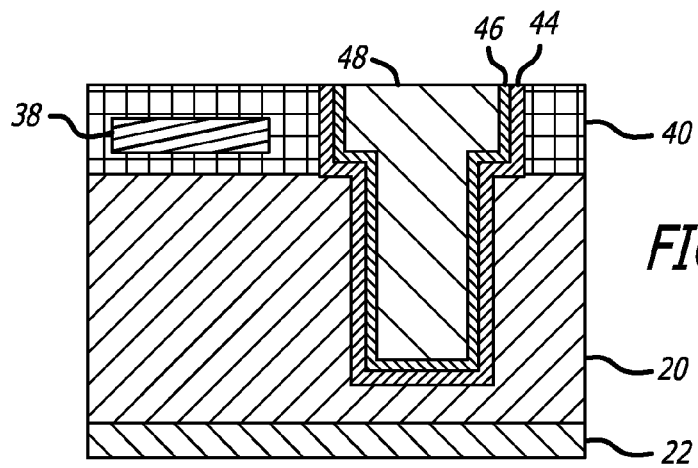
Figure 20:
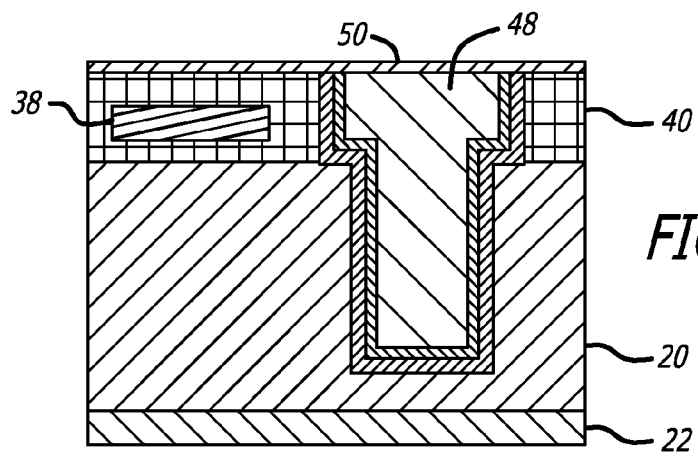
Figure 21:
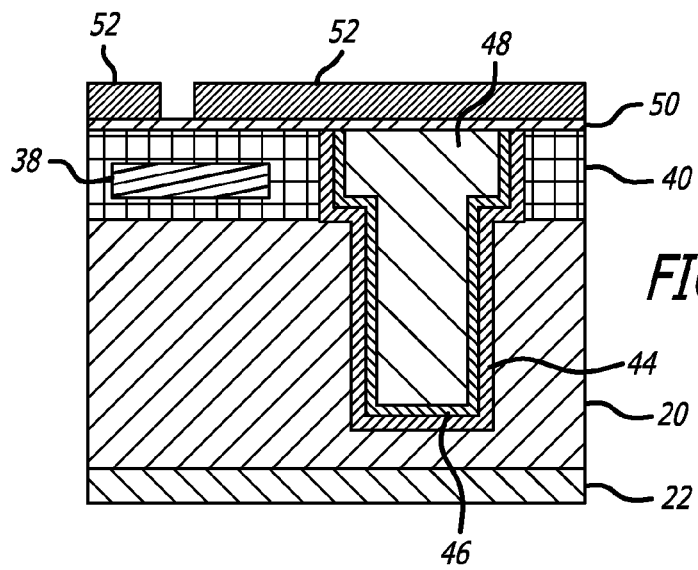
Figure 22:
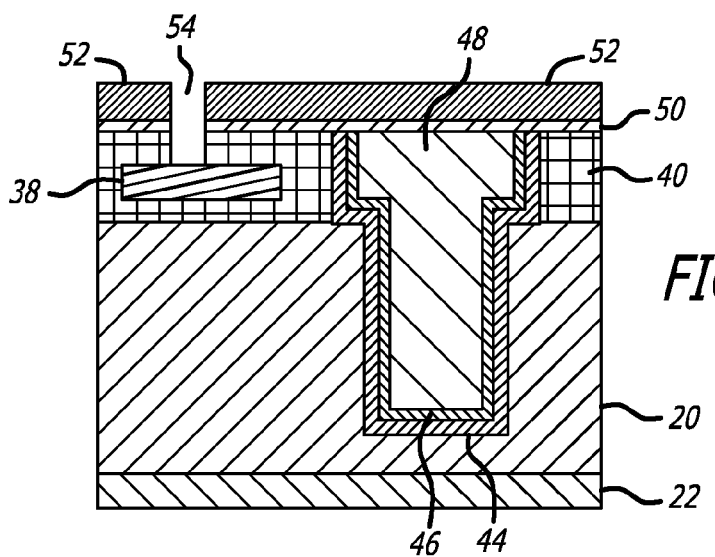
Figure 23:
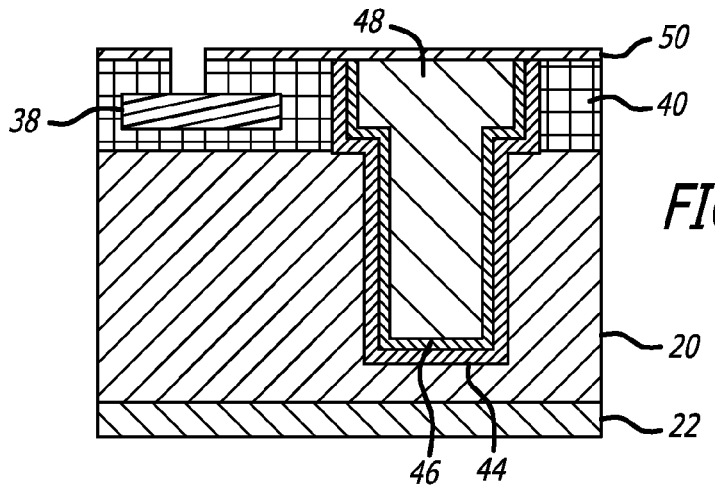

FIG. 12 illustrates the substrate 20, the substrate having the capacitors formed therein in an area of the substrate not shown, with metal interconnects 38 in oxide layers 40. In that regard, while one interconnect layer 38 is schematically shown, frequently multiple interconnect layers will be required. The first step is to put down and pattern a photoresist layer 42 (FIG. 13) and then to perform a via and isolation channel through an oxide-silicon etch as shown in FIG. 14. (This and FIGS. 15 and 16 show a wider section of substrate 20 than the earlier Figures to illustrate the formation and filling of the isolation trench, though the wider section of substrate is not shown in FIGS. 17 through 42 so as to not clutter those Figures.) This is performed using a deep reactive ion etch at each location where a through silicon via and isolation trench is needed. This etch is deeper than that used for the trenches in which the capacitors are formed. Before the photoresist is stripped off an isotropic oxide etch is used to etch the oxide window sideways (FIG. 15). The photoresist is then stripped off (FIG. 15), a through silicon via oxide liner 44 is deposited (FIG. 16) and then a barrier seed layer 46 is deposited as shown in FIG. 17. The isolation trench in the preferred embodiment has a width of somewhat less than twice the oxide liner thickness, so is completely filled by the oxide. This ultimately will electrically isolate each capacitor from adjacent capacitors or other circuitry on the substrate, which may be other passive or active circuitry as is known in the art. Now a through silicon via copper plating 48 is applied as shown in FIG. 18 and then the surface is subjected to chemical mechanical polishing to remove the excess cooper and to expose the copper in the through silicon via as insulated from the substrate 20, as shown in FIG. 19, and to expose the top of the oxide filled isolation channels (not shown).

Figure 24:
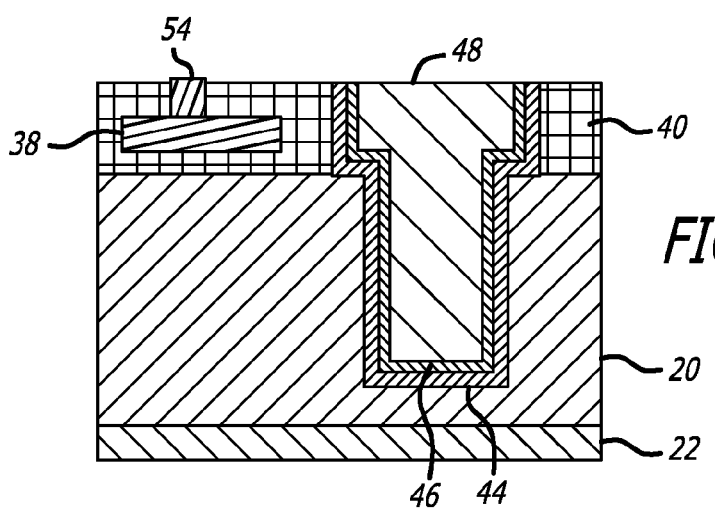
Figure 25:
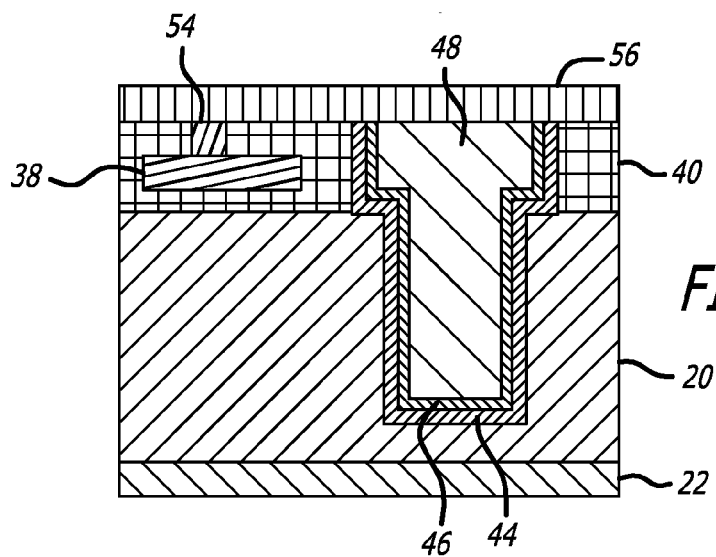
Figure 26:
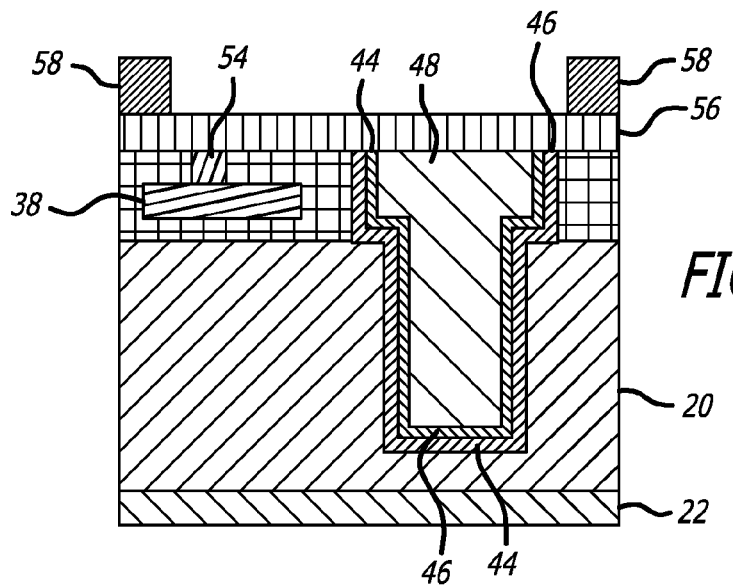
Figure 27:
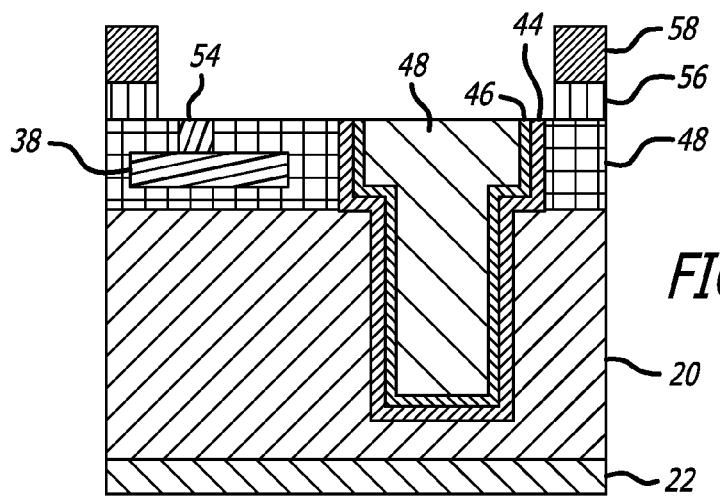

A stop layer 50 is deposited (FIG. 20), a photoresist 52 is applied and patterned (FIG. 21) and a contact opening 54 is etched through the stop layer 50 and the oxide layers 40 to expose the appropriate interconnect metals 38. The photomask material 52 is then removed (FIG. 23) and a layer of tungsten is deposited, filling opening 54. After chemical mechanical polishing, the excess tungsten and the stop layer 50 are removed as shown in FIG. 24. An oxide layer 56 is then deposited (FIG. 25), a photoresist is applied and developed to form photomask 58 over the oxide layer 56 (FIG. 26) and the oxide layer 56 is then etched as shown in FIG. 27, exposing the copper 48 in the through silicon via as well as the tungsten in opening 54.

Figure 28:
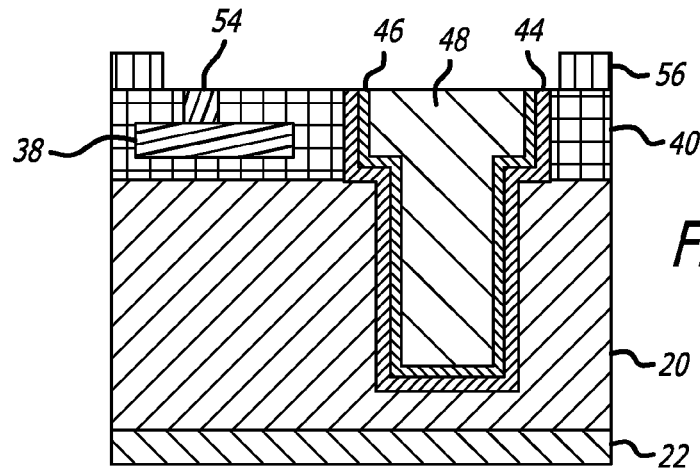
Figure 29:
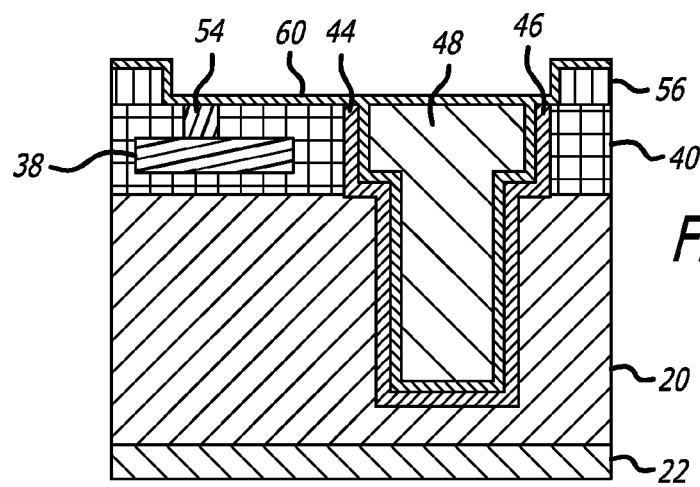
Figure 30:
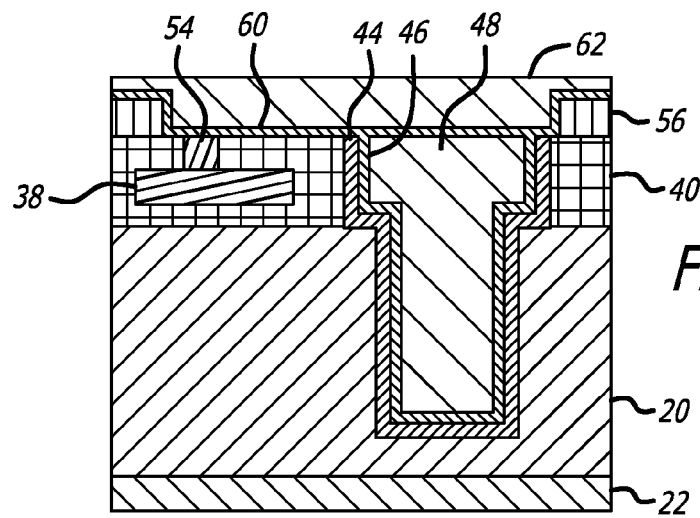
Figure 31:
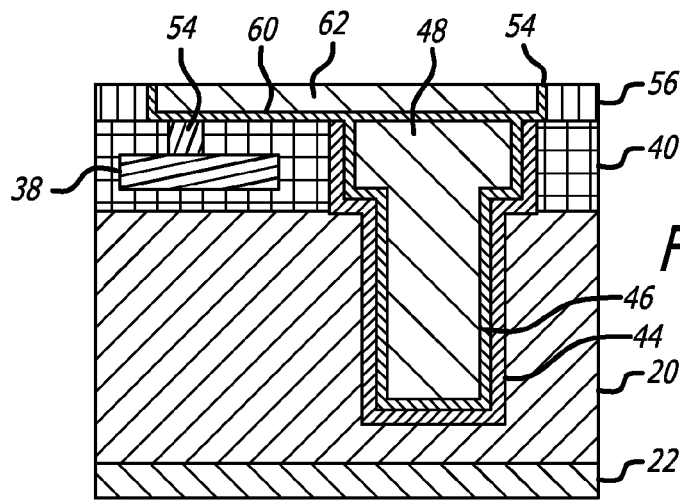
Figure 32:
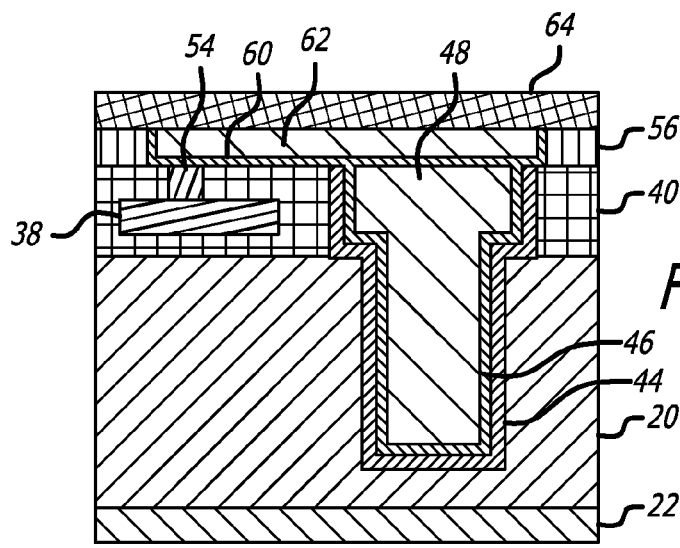
Figure 33:
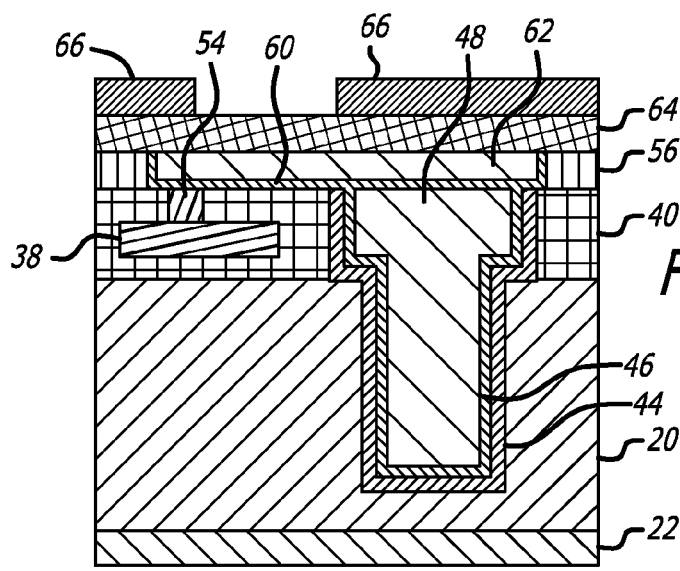
Figure 34:
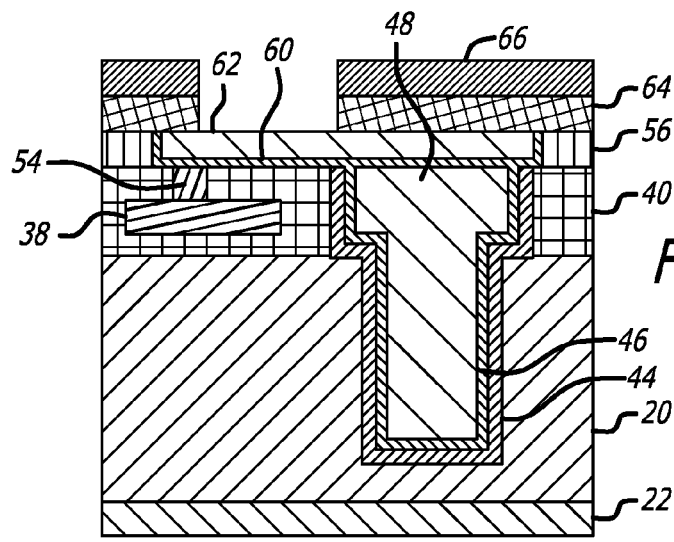
Figure 35:
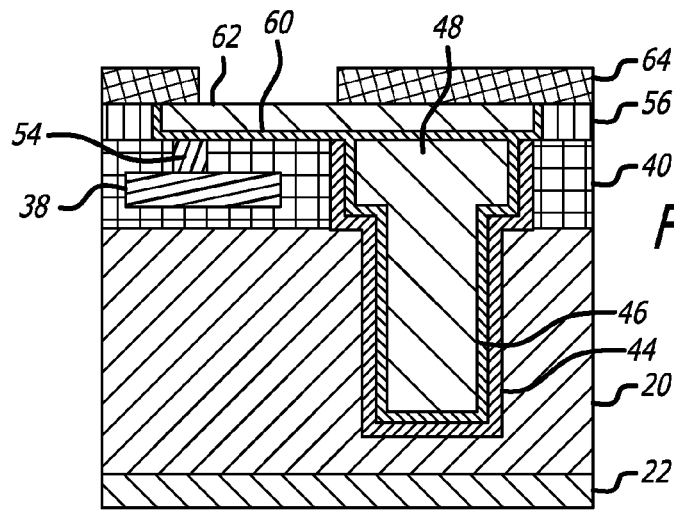
Figure 36:
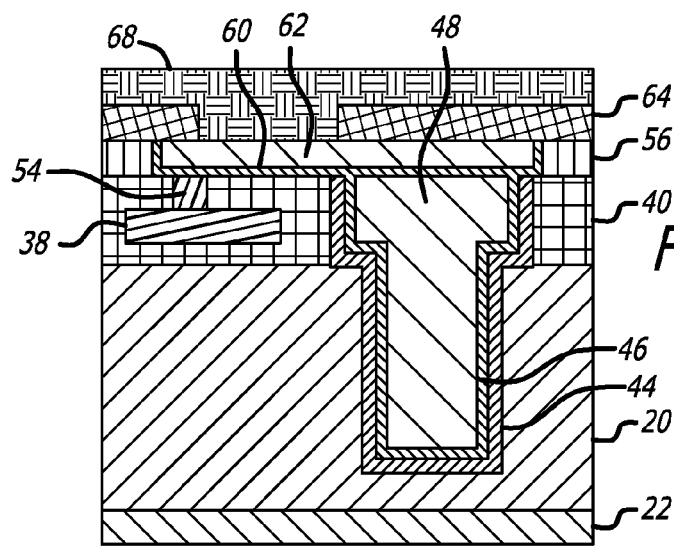
Figure 37:
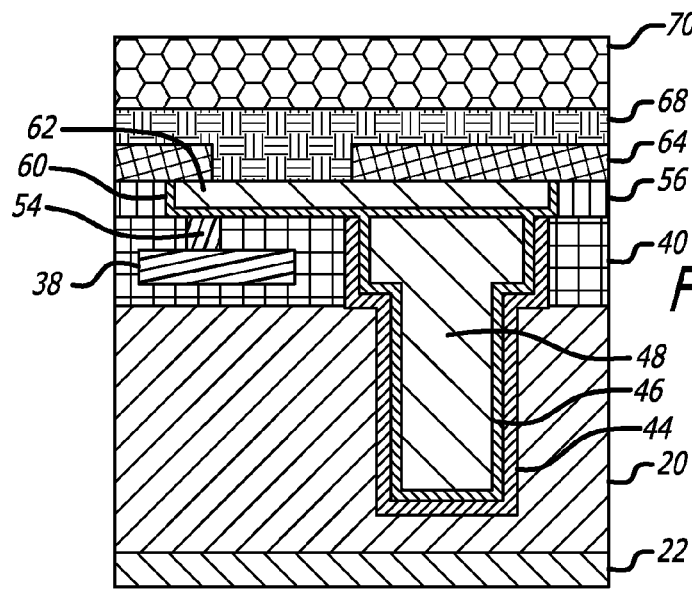
Figure 38:
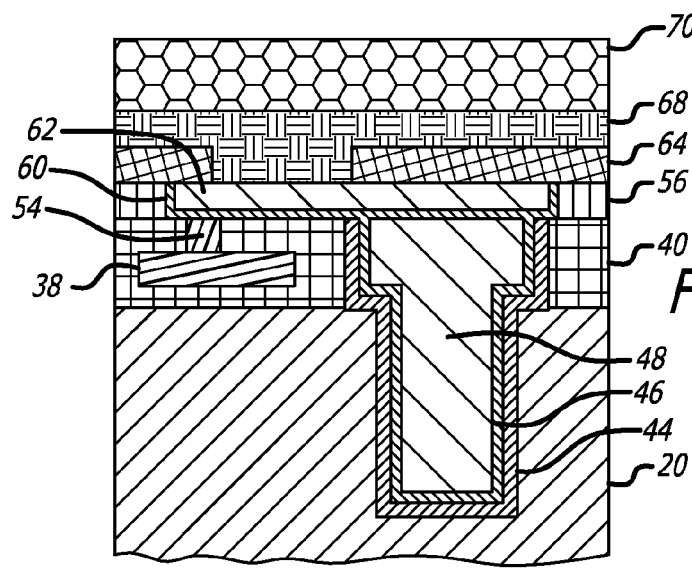
Figure 39:
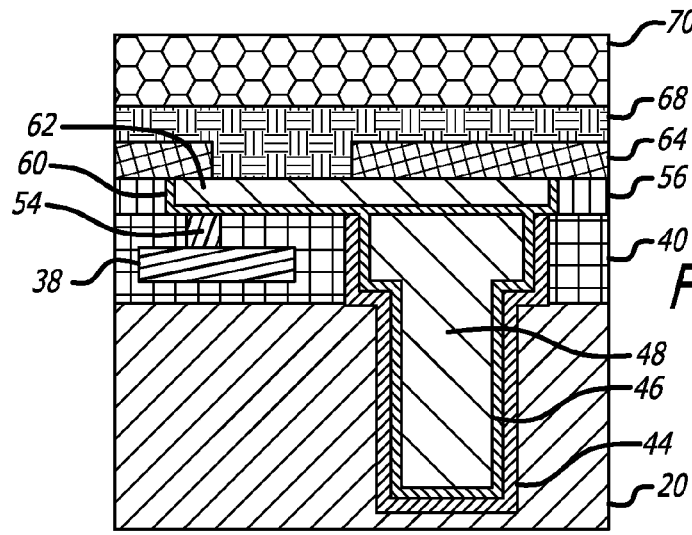

The photomask is then removed as shown in FIG. 28, a metal barrier seed layer 60 is applied (FIG. 29) and then copper plating 62 is applied thereover as shown in FIG. 30. The top surface of the wafer is then again subjected to chemical mechanical polishing as shown in FIG. 31 and a passivation oxide layer 64 is deposited (FIG. 32). A photoresist 66 is then applied and patterned as shown in FIG. 33 and the passivation oxide layer etched (FIG. 34) and the photoresist 66 removed as shown in FIG. 35 to expose the copper layer 62. Then in accordance with a preferred process, a temporary glue layer 68 is applied (FIG. 36) and a carrier 70 is temporarily bonded to the top of the structure previously formed (FIG. 37) to provide support for the wafer 20 and the structures formed therein. Then as shown in FIG. 38, the backside of the substrate 20 is subjected to a coarse grind to remove the backside oxide layer 22 and most of the Silicon substrate 20 (FIG. 1) and then a fine polish as shown in FIG. 39. These Figures, of course, are only schematic, in that significant thinning of the wafer is accomplished in these operations to bring the lower ends of the through silicon vias relatively close to the backside of the substrate.

Figure 40:
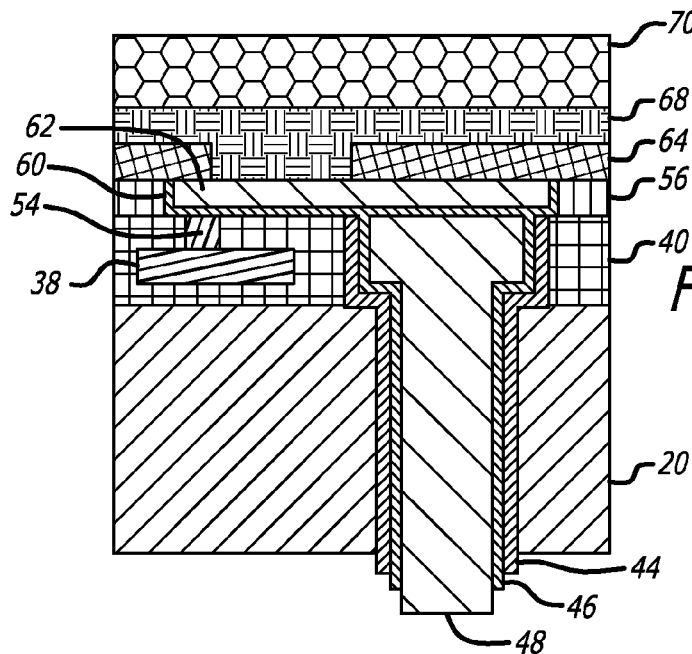

The next step in the process is to perform a backside plasma etch to expose the bottom end of the copper 48 in the through silicon via (FIG. 40). This operation electrically separates the capacitors, if not already separated, by exposing the lower ends of the oxide filled isolation trenches surrounding each capacitor and associated vias (which may be a parallel combination of two or more capacitors), but does not expose the bottoms of the capacitors, as the insulator filled trenches and the vias are deeper than the trenches in which the capacitors are formed. The copper will now extend slightly below the bottom surface of the substrate 20 and below the ends of the oxide layer 44.

Figure 41:
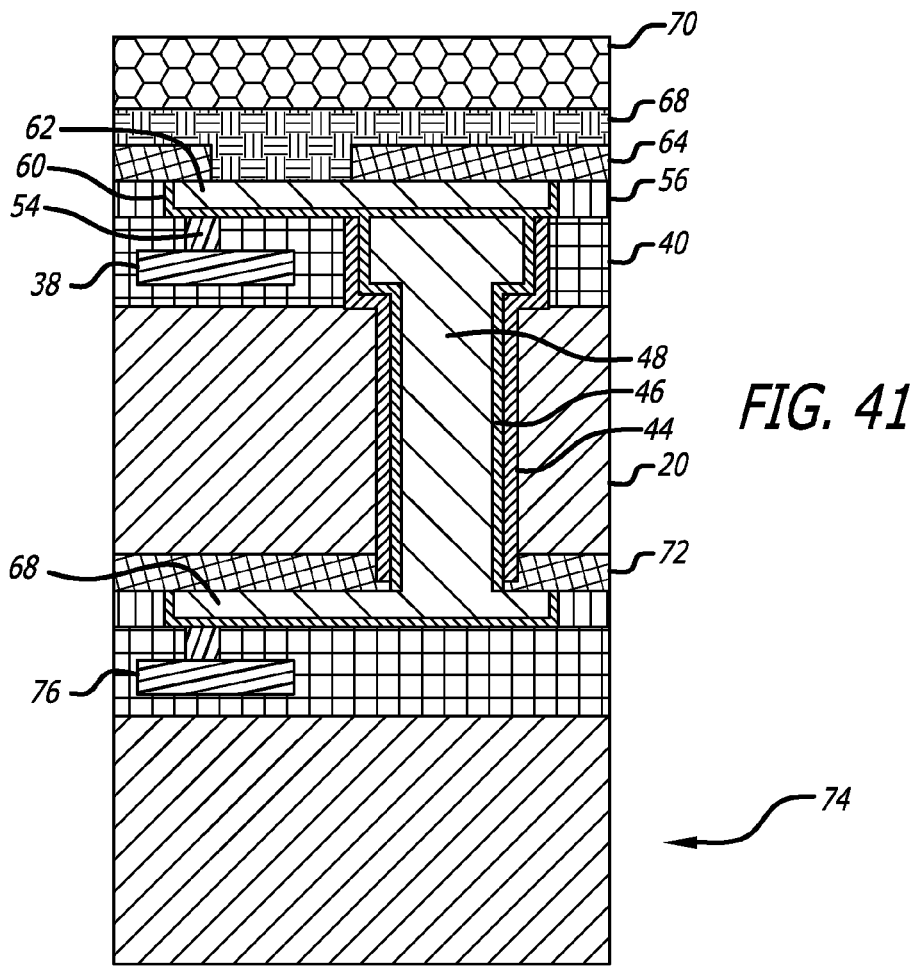
FIG. 41 illustrates the thermo-bonding of one wafer, such as a wafer containing trench capacitors in accordance with FIGS. 1 though 10, to another wafer containing integrated circuits.
Figure 42:
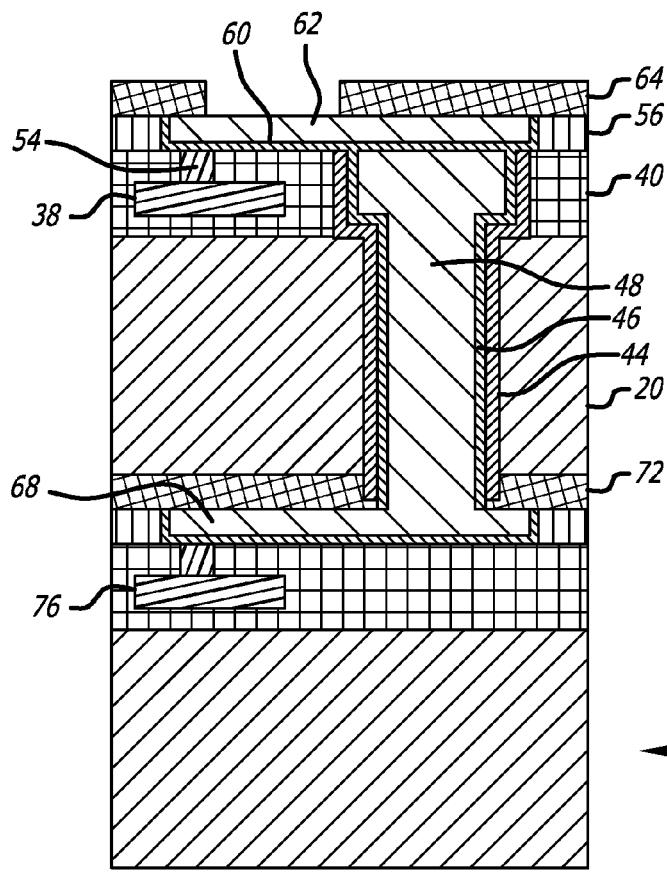
FIG. 42 illustrates the completion of the bonded wafers ready for such additional processes such as bonding to an additional wafer or for solder bumping and dicing.

Now the wafer is ready for bonding to a second wafer, typically an integrated circuit wafer, with copper contact areas 68 exposed through passivation oxide layer 72. This is shown in FIGS. 41 and 42. The integrated circuit wafer generally indicated by the numeral 74 (FIG. 41) typically will contain an integrated circuit including multiple interconnect layers 76 below the surface of the passivation oxide, with copper contact areas 68 electrically connected thereto. Bonding of the two wafers together preferably is by thermo-compression copper to copper bonding. "Integrated circuit" as used herein and in the claims does not necessarily mean a functional integrated circuit, in that to function, that integrated circuit is likely to require coupling to the capacitors and possibly other passive or active devices in the upper wafer 20, and for that matter, possibly one or more discrete devices or other integrated circuits connected thereto. Finally the temporary carrier 70 (FIG. 41) and glue layer 68 are removed to provide the structure shown in FIG. 42. In that regard, it will be noted that copper layer 48 provides the through silicon via to connect the copper contact 68 connected to interconnect 76 on the bottom wafer 74 to the interconnect 38 on wafer 20 as well as to provide an exposed area of copper region 62 for connection to the outside world by way of a circuit terminal, or alternatively, for thermo-compression bonding to still another wafer in accordance with the method of thermo-compression bonding the two wafers as described herein. Alternatively, the two bonded wafers may be first diced, and then die to die bonded to still another die. In any event, the final package is a mechanically and electrically bonded and diced stack of a combination of active and passive circuit elements, including the trench capacitors.

Figure 43:
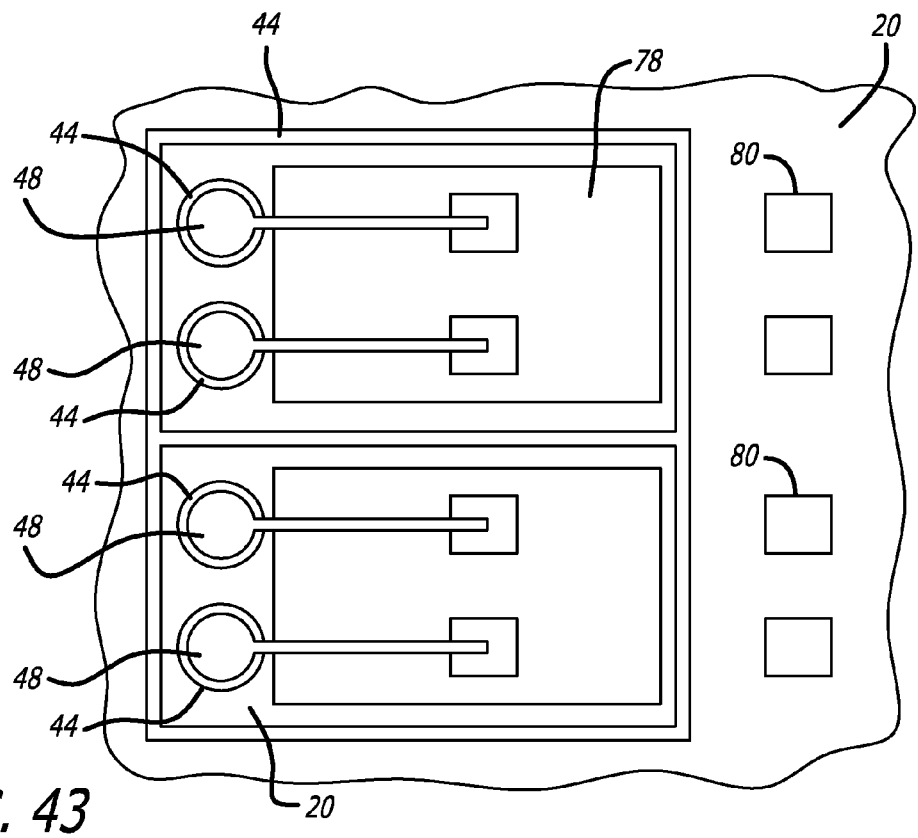
FIG. 43 is a schematic top view of an area of the substrate 20 illustrating multiple capacitors and other devices on substrate 20.

A schematic top view of a larger area of the substrate 20 may be seen in FIG. 43. The section of substrate 20 around each of the two adjacent capacitors shown in areas 78, together with the pair of vias 48 making contact to the two capacitor contacts are isolated from each adjacent area of substrate 20 by the trench surrounding areas 78 and the vias, the trench extending to the passivation layer 72 (FIGS. 41 and 42) and filled with the same oxide as is insulating the copper filled vias from the adjacent substrate 20 area. FIG. 43 also illustrates additional devices 80 formed on the same substrate, which devices may be active or other passive devices, or a combination thereof, such as, by way of example, transistors and resistors.

It should be noted that FIG. 42 is schematic only, though is generally representative of the various connections which can be made between wafers and to the outside world. In particular, the through silicon via copper 48 may not be connected to interconnect layers in the upper wafer 20 but instead may simply provide an input or output terminal for coupling the outside world to the circuit on the lower wafer 74. Alternatively copper 48 in the through silicon via may connect to one or more interconnect layers 38 in the upper wafer 20, though not be exposed for connection to the outside world. Such a connection would allow the integration of capacitors of greater size than could reasonably be integrated into the integrated circuit itself, to be connected at midpoints of the integrated circuit as opposed to input or output connections.

Thus preferred embodiments of the present invention use:

Wafer-to-wafer bonding, a known technique especially in the memory business. In this manner, all devices on one wafer are attached to respective devices on another wafer simultaneously, rather than the individual chip-to-chip bonding process as described above.

The passive (or alternatively also active) capacitor chip will be of the same size as the normally smaller IC chip to minimize form factor and wafer waste if wafer to wafer bonding is used.

The capacitors may be individual capacitors or each may be a series of parallel capacitors (2 or more) with a single CMP (chemical-mechanical polishing) process substituting for repeated photo steps, thus reducing the number of moves and chip cost while increasing yield.

The chip capacitor module, with or without active devices, is integrated to the active IC or ICs using a 3D Modular Integration (3DMI) approach to minimize pinouts. The 3DMI approach employs a vertical integration Through-Silicon Via (TSV) method, which is well known in the industry. However this Via-last TSV approach is unique because it also provides a 2D interconnection layer simultaneously with the TSV 3D interconnect, hence further reducing process moves and cost.

The formation of trench capacitors is well known in the industry. However the trench capacitor structure of preferred embodiments is unique in the following aspects:

All the trench capacitor electrodes are formed simultaneously using a CMP step. Multiple and sequential photo steps, etch steps and cleaning steps are eliminated. This minimizes moves and cost. Due to CMP, contacts to electrodes are at the same topographical height and depth, greatly improving contact Photo and Etch manufacturability and reducing the thickness of interlevel dielectric oxides which need to be chemically-mechanically polished before contact photo steps. In particular, note that once the trench etch is complete (FIGS. 3A-3C), the capacitors are formed by deposition of dielectric and conductive layers until the trench is intentionally completely filled, all without any further photo steps, with the capacitors being separated in the CMP step and the chip planarized at the same time to aid in the formation of the interconnection of the capacitors and the vias as desired. The elimination of successive photo steps not only reduces fabrication costs and improves yield, but also eliminates the need to allow for mask alignment tolerances, allowing the closer spacing of the capacitors or the realization of larger capacitors on a chip that is the same size as the IC it will be connected to.

Trench capacitors with different capacitance densities can be employed at the same IC level. This will make the chip equal in area to the IC chip, thus allowing for wafer-to-wafer as opposed to chip-to-chip or chip-to-wafer bonding.

Yield is greatly improved also because at no stage are any of the dielectric or electrode surfaces exposed to photoresist and subsequent photoresist removal steps, which are well known in the industry to cause potential yield and/or reliability problems in capacitors.

The wafer-to-wafer integration formation to connect the Passive chip(s) to the Active chip(s) utilizes the well-known TSV technology in a unique way. It is utilized as a non-traditional via-last TSV approach which allows for the metal to form both 3D chip-to-chip interconnects as well as 2D device-to-device interconnects. This allows for wafer-to-wafer 3D interconnect. Furthermore the process can be repeated so that 2, 3 or many wafers can be bonded together with chips of the same size interconnected vertically. Costing analysis shows that this is the least expensive way of 3D modular integration for analog circuitry.

Thus the present invention has a number of aspects, which aspects may be practiced alone or in various combinations or sub-combinations, as desired. While a preferred embodiment of the present invention has been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A method of making a trench capacitor comprising:
   a) etching a first trench in a substrate from a first surface of the substrate, the first trench having a first region and a second region that is narrower than the first region;
   b) coating the first surface of the substrate and the first trench with an insulator;
   c) coating the insulator on the first surface of the substrate and the first trench with a conductor, the conductor together with the insulator filling the second region of the trench but not filling the first region of the trench;
   d) coating the conductor with an insulator and coating the insulator with a coating of metal at least once more the last coating of the conductor filling the first region of the trench
   e) chemical-mechanical polishing the first surface of the substrate to remove all the conductor and the insulator coatings on the first surface of the substrate to expose all the edges of the insulator and the conductor coatings in the first trench for providing interconnects thereto.

2. The method of claim 1 wherein the conductor is a metal.

3. The method of claim 1 wherein the conductor is doped polysilicon.

4. The method of claim 1 further comprised of etching via openings and an isolation trench deeper into the substrate than the first trench and coating the first surface of the substrate and via openings with an oxide, the oxide filling the isolation trench, the isolation trench circumscribing the trench capacitor in the first trench and a pair of via openings.

5. The method of claim 4 further comprised of depositing a conductive layer onto the first surface of the substrate and the oxide to fill the via openings, and chemical-mechanical polishing the first surface of the substrate to remove the conductive layer from the first surface of the substrate, leaving the conductive layer filling the via openings.

6. The method of claim 5 further comprised of electrically interconnecting the conductors of the trench capacitor in the first trench with the conductive layer filling the vias within the isolation trench, including interconnecting the coating of c) in the second region of the trench with the conductive layer filling a via.

7. The method of claim 6 further comprised of chemical-mechanical polishing a second surface of the substrate opposite the first surface of the substrate, and etching the second surface of the substrate to expose the oxide and the conductive layer filling the via openings and the oxide in the isolation trench, but not the trench capacitor in the first trench.

8. The method of claim 7 wherein the conductive layer in the via openings exposed at the second surface of the substrate is electrically and mechanically bonded to respective conductive areas of an integrated circuit.

9. The method of claim 8 wherein the electrical and mechanical bonding is wafer to wafer bonding.

10. The method of claim 8 wherein the conductive layer in the via openings is copper, and wherein the substrate is electrically and mechanically bonded to respective conductive areas of an integrated circuit by thermo-compression bonding.

11. The method of claim 10 wherein the electrical and mechanical bonding is wafer to wafer bonding.

12. The method of claim 1 wherein the substrate is silicon and further comprised of fabricating other devices on the substrate selected from the group consisting of active devices and passive devices.

13. A method of making a trench capacitor comprising:
a) etching a first trench in a substrate from a first surface of the substrate;
b) coating the first surface of the substrate and the first trench with an insulator;
c) coating the insulator on the first surface of the substrate and the first trench with a conductor;
d) chemical-mechanical polishing the first surface of the substrate to remove the conductor and the insulator coatings on the first surface of the substrate to expose the edges of the insulator and the conductor coatings in the first trench for providing interconnects thereto;
e) etching via openings and an isolation trench deeper into the substrate than the first trench and coating the first surface of the substrate and via openings with an oxide, the oxide filling the isolation trench, the isolation trench circumscribing the trench capacitor in the first trench and a pair of via openings.

14. The method of claim 13 further comprised of depositing a conductive layer onto the first surface of the substrate and the oxide to fill the via openings, and chemical-mechanical polishing the first surface of the substrate to remove the conductive layer from the first surface of the substrate, leaving the conductive layer filling the via openings.

15. The method of claim 14 further comprised of electrically interconnecting the conductors of the trench capacitor with the conductive layer filling the vias within the isolation trench.

16. The method of claim 15 further comprised of chemical-mechanical polishing a second surface of the substrate opposite the first surface of the substrate, and etching the second surface of the substrate to expose the oxide and the conductive layer filling the via openings and the oxide in the isolation trench, but not the trench capacitor.

17. The method of claim 16 wherein the conductive layer in the via openings exposed at the second surface of the substrate is electrically and mechanically bonded to respective conductive areas of an integrated circuit.

18. The method of claim 17 wherein the electrical and mechanical bonding is wafer to wafer bonding.

19. The method of claim 17 wherein the conductive layer in the via openings is copper, arid wherein the substrate is electrically and mechanically bonded to respective conductive areas of an integrated circuit by thermo-compression bonding.

20. The method of claim 19 wherein the electrical and mechanical bonding is wafer to wafer bonding.

21. The method of claim 13 wherein the substrate is silicon and further comprised of fabricating other devices on the substrate selected from the group consisting of active devices and passive devices.

22. A method of making trench capacitors comprising:
a) etching first trenches in a silicon substrate from a first surface of the substrate, the first trenches each having a first region and a second region that is narrower than the first region;
b) coating the first surface of the substrate and the first trenches with an insulator;
c) coating the insulator on the first surface of the substrate and the first trenches with a conductor, the conductor together with the insulator filling the second regions of the trenches but not filling the first regions of the trenches;
d) coating the conductor with an insulator and coating the insulator with a coating of metal at least once more, the last coating of the conductor filling the first trenches;
e) chemical-mechanical polishing the first surface of the substrate to remove the conductor and the insulator coatings on the first surface of the substrate to expose the edges of the insulator and the conductor coatings in the first trenches for providing interconnects thereto.

23. The method of claim 22 wherein the conductor is a metal.

24. The method of claim 22 wherein the conductor is doped polysilicon.

25. The method of claim 22 further comprised of fabricating other devices on the substrate selected from the group consisting of active devices and passive devices.

26. A method of making trench capacitors comprising:
a) etching first trenches in a silicon substrate from a first surface of the substrate;
b) coating the first surface of the substrate and the first trenches with an insulator;
c) coating the insulator on the first surface of the substrate and the first trenches with a conductor;
d) coating the conductor with an insulator and coating the insulator with a coating of metal at least once more, the last coating of the conductor fillin the first trenches;
e) chemical-mechanical polishing the first surface of the substrate to remove the conductor and the insulator coatings on the first surface of the substrate to expose the edges of the insulator and the conductor coatings in the first trenches for providing interconnects thereto.
f) etching via openings and isolation trenches deeper into the substrate than the first trenches and coating the first surface of the substrate and via openings with an oxide, the oxide filling the isolation trenches, the isolation trenches circumscribing each trench capacitor and a pair of via openings.

27. The method of claim 26 further comprised of depositing copper onto the first surface of the substrate and the oxide to fill the via openings, and chemical-mechanical polishing the first surface of the substrate to remove the conductive layer from the first surface of the substrate, leaving the copper filling the via openings.

28. The method of claim 27 further comprised of electrically interconnecting the conductor layers of the trench capacitors with the copper filling the vias within the respective isolation trenches.

29. The method of claim 28 further comprised of chemical-mechanical polishing a second surface of the substrate opposite the first surface of the substrate, and etching the second surface of the substrate to expose the oxide and the copper filling the via openings and the oxide in the isolation trenches, but not the trench capacitors.

30. The method of claim 29 further comprised of thermo-compression bonding the copper in the via openings at the second surface of the substrate to respective copper contact areas of an integrated circuit.

31. The method of claim 30 wherein the thermo-compression bonding is wafer to wafer bonding.

32. A method of making trench capacitors comprising:
   a) etching a first trench in a substrate from a first surface of the substrate, the first trench having a first region and a second region that is narrower than the first region;;
   b) coating the first surface of the substrate and the first trench with an insulator;
   c) coating the insulator on the first surface of the substrate and the first trench with a conductor, the conductor together with the insulator filling the second region of the trench but not filling the first region of the trench;
   d) coating the conductor with an insulator and coating the insulator with a coating of metal at least once more, the last coating of the conductor filling the first region of the trench;
   e) chemical-mechanical polishing the first surface of the substrate to remove all the conductor and the insulator coatings on the first surface of the substrate to expose all the edges of the insulator and the conductor coatings in the first trench for providing interconnects thereto;
   e) etching via openings and an isolation trench deeper into the substrate than the first trench and coating the first surface of the substrate and via openings with an oxide, the oxide filling the isolation trench, the isolation trench circumscribing a trench capacitor in the first trench and a pair of via openings.

33. The method of claim 32 further comprised of depositing a conductive layer onto the first surface of the substrate and the oxide to fill the via openings, and chemical-mechanical polishing the first surface of the substrate to remove the conductive layer from the first surface of the substrate, leaving the conductive layer filling the via openings.

34. The method of claim 33 further comprised of electrically interconnecting the conductors of the trench capacitors with the conductive layer filling the vias within the respective isolation trenches.

35. The method of claim 34 further comprised of chemical-mechanical polishing a second surface of the substrate opposite the first surface of the substrate, and etching the second surface of the substrate to expose the oxide and the conductive layer filling the via openings and the oxide in the isolation trenches, but not the trench capacitors.

36. The method of claim 35 wherein the conductive layer in the via openings exposed at the second surface of the substrate is electrically and mechanically bonded to respective conductive areas of an integrated circuit.

37. The method of claim 36 wherein the electrical and mechanical bonding is wafer to wafer bonding.

38. The method of claim 36 wherein the conductive layer in the via openings is copper, and wherein the substrate is electrically and mechanically bonded to respective conductive areas of an integrated circuit by thermo-compression bonding.

39. The method of claim 38 wherein the electrical and mechanical bonding is wafer to wafer bonding.

40. The method of claim 32 wherein the substrate is silicon and further comprised of fabricating other devices on the substrate selected from the group consisting of active devices and passive devices.

* * * * *